United States Patent
Takahashi et al.

(10) Patent No.: US 10,707,246 B2
(45) Date of Patent: Jul. 7, 2020

(54) SOLID STATE IMAGING DEVICE AND METHOD FOR MANUFACTURING SAME

(71) Applicant: TowerJazz Panasonic Semiconductor Co., Ltd., Uozu (JP)

(72) Inventors: Hiroki Takahashi, Osaka (JP); Hiroshi Tanaka, Kyoto (JP)

(73) Assignee: TowerJazz Panasonic Semiconductor Co., Ltd., Uozu, Toyama (JP)

( * ) Notice: Subject to any disclaimer, the term of this patent is extended or adjusted under 35 U.S.C. 154(b) by 0 days.

(21) Appl. No.: 15/940,822

(22) Filed: Mar. 29, 2018

(65) Prior Publication Data

US 2018/0219036 A1 Aug. 2, 2018

Related U.S. Application Data

(63) Continuation of application No. PCT/JP2016/000616, filed on Feb. 5, 2016.

(51) Int. Cl.
*H01L 27/146* (2006.01)
*H04N 5/369* (2011.01)

(52) U.S. Cl.
CPC .... *H01L 27/14603* (2013.01); *H01L 27/1463* (2013.01); *H01L 27/14616* (2013.01); *H01L 27/14643* (2013.01); *H01L 27/14656* (2013.01); *H04N 5/369* (2013.01)

(58) Field of Classification Search
None
See application file for complete search history.

(56) References Cited

U.S. PATENT DOCUMENTS

2002/0125513 A1 9/2002 Inoue
2009/0086066 A1* 4/2009 Itonaga ............. H01L 27/14603
348/294

FOREIGN PATENT DOCUMENTS

| JP | 2000150848 A | 5/2000 |
| JP | 200360191 A | 2/2003 |
| JP | 2006134915 A | 5/2006 |
| JP | 2010225769 A | 10/2010 |

OTHER PUBLICATIONS

International Search Report dated Apr. 26, 2016 re: Application No. PCT/JP2016/000616, pp. 1, citing: JP 2006-134915 A, JP 2000-150848 A and JP 2010-225769 A.

* cited by examiner

*Primary Examiner* — Michelle Mandala
(74) *Attorney, Agent, or Firm* — Knobbe, Martens, Olson & Bear, LLP

(57) ABSTRACT

In a solid state imaging device having a plurality of pixels arranged in a matrix on a substrate, each of the plurality of pixels includes a photoelectric conversion region and an element separation region separating the photoelectric conversion region. The substrate includes a semiconductor substrate, a first epitaxial layer formed on the semiconductor substrate, and a second epitaxial layer formed on the first epitaxial layer. The photoelectric conversion region and the element separation region are formed over the first epitaxial layer and the second epitaxial layer.

5 Claims, 7 Drawing Sheets

SOLID STATE IMAGING DEVICE AND METHOD FOR MANUFACTURING SAME

CROSS-REFERENCE TO RELATED APPLICATIONS

This is a continuation of International Application No. PCT/JP2016/000616 filed on Feb. 5, 2016, which claims priority to Japanese Patent Application No. 2015-192929 filed on Sep. 30, 2015. The entire disclosures of these applications are incorporated by reference herein.

BACKGROUND

In recent years, many image sensors with improved infrared sensitivity have been proposed. For example, for an image sensor using a silicon substrate, a proposed device includes a photoelectric conversion photodiode having a large thickness (e.g., 3 µm or more) to improve the infrared sensitivity because an infrared ray absorption coefficient of silicon is small. As a specific example, Japanese Unexamined Patent Publication No. 2003-60191 discloses an example of a photodiode having the thickness of 10 µm.

SUMMARY

However, in the solid state imaging device having a thick photoelectric conversion region as described above, performance degradation occurs such as an increase in color mixture between pixels, a decrease in sensitivity, and a read failure.

In view of the foregoing, a reduction in the performance degradation in the solid state imaging device having a thick photoelectric conversion region will be described.

The inventors of the present invention analyzed the cause of the performance degradation as described above and discovered that the potential barrier of the element separation region surrounding the photoelectric conversion region is not sufficiently formed in the deep part of the substrate by increasing the thickness of the photoelectric conversion region, and the potential gradient in the depth direction in the photoelectric conversion region is not formed in a preferably form. In other words, they discovered that, as a result of increasing the thickness of the photoelectric conversion region, it is difficult to form an appropriate potential gradient and element separation by a method that simply uses ion implantation or the like using a resist mask, and this causes color mixture, sensitivity decrease or the like.

In a first solid state imaging device of the present disclosure, a plurality of pixels are arranged in a matrix on a substrate. Each of the plurality of pixels includes a photoelectric conversion region and an element separation region separating the photoelectric conversion region. The substrate includes a semiconductor substrate, a first epitaxial layer formed on the semiconductor substrate, and a second epitaxial layer formed on the first epitaxial layer. The photoelectric conversion region and the element separation region are formed over the first epitaxial layer and the second epitaxial layer.

According to the solid state imaging device of the present disclosure, by forming the photoelectric conversion region and the element separation region over the plurality of epitaxial layers, it is possible to form a potential barrier of the element separation region surrounding the photoelectric conversion region regardless of the thickness of the photoelectric conversion region, and the potential gradient of the photoelectric conversion region can be formed more appropriately. As a result, the performance degradation such as color mixture, a sensitivity decrease, and a read failure can be reduced.

BRIEF DESCRIPTION OF THE DRAWINGS

Following FIG. 5.

Following FIG. 6.

Following FIG. 7.

DETAILED DESCRIPTION

A solid state imaging device of the present disclosure will be described with reference to the drawings. First, the cause of occurrence of color mixture, sensitivity decrease, read failure, etc. in a solid state imaging device having a thick photoelectric conversion region will be described.

Figure 9:
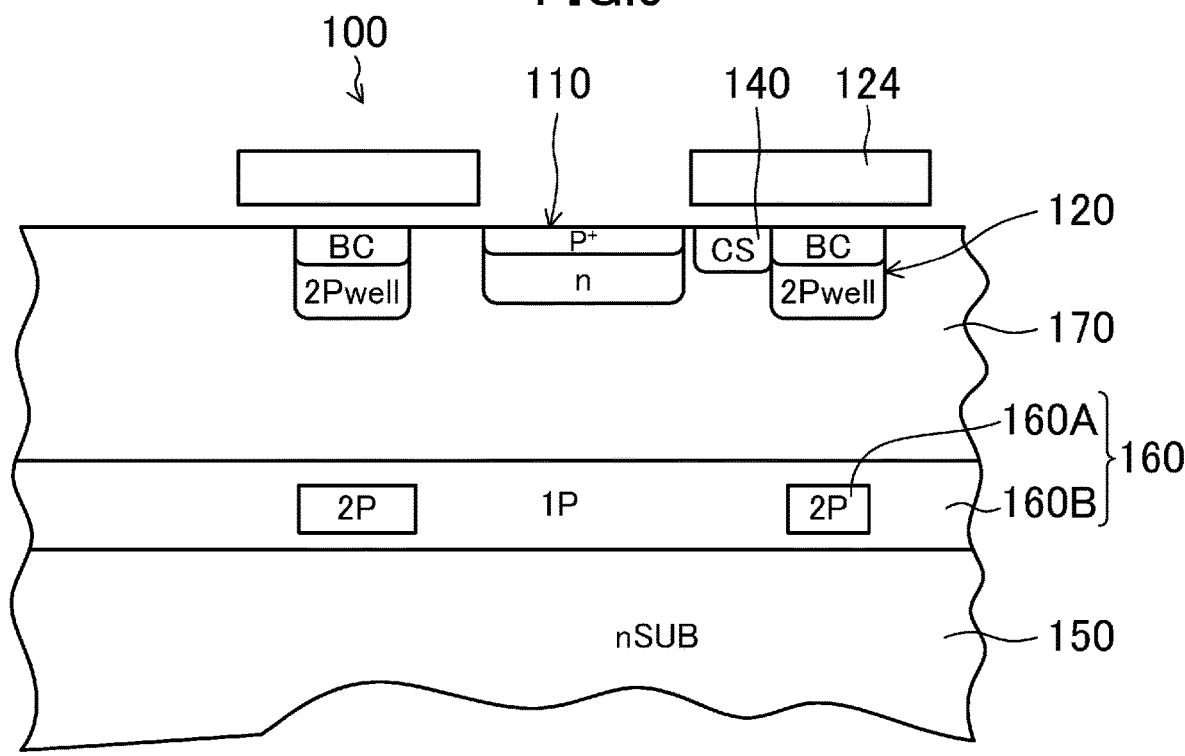
FIG. 9 is a diagram showing a normal solid state imaging device having a photoelectric conversion layer having a large thickness.

FIG. 9 is a schematic view of a cross section of the solid state imaging device 100 having the thick photoelectric conversion region to improve the infrared sensitivity. An overflow barrier layer 160 is formed on a silicon substrate 150, and a high resistance epitaxial layer 170 is further formed on the overflow barrier layer 160. The high-resistance epitaxial layer 170 is provided with, e.g., a photosensor 110, a vertical transfer register 120, and a channel stop region 140. The overflow barrier layer 160 is formed by implanting ions into the silicon substrate 150 before forming the epitaxial layer 170. The overflow barrier layer 160 includes an overall barrier region 160B, and a high concentration barrier region 160A below the vertical transfer register 120.

In the solid state imaging device 100, the epitaxial layer 170 has a thickness of, e.g., 10 μm, and thus the sensitivity is improved in the near infrared region.

In such a solid state imaging device, there is a region where a potential barrier for element separation is not formed between the vertical transfer register 120 and the overflow barrier layer 160. When charges are generated by photoelectric conversion near this region, the charges leak to adjacent pixels, and a color mixture between pixels occurs.

Figure 10:
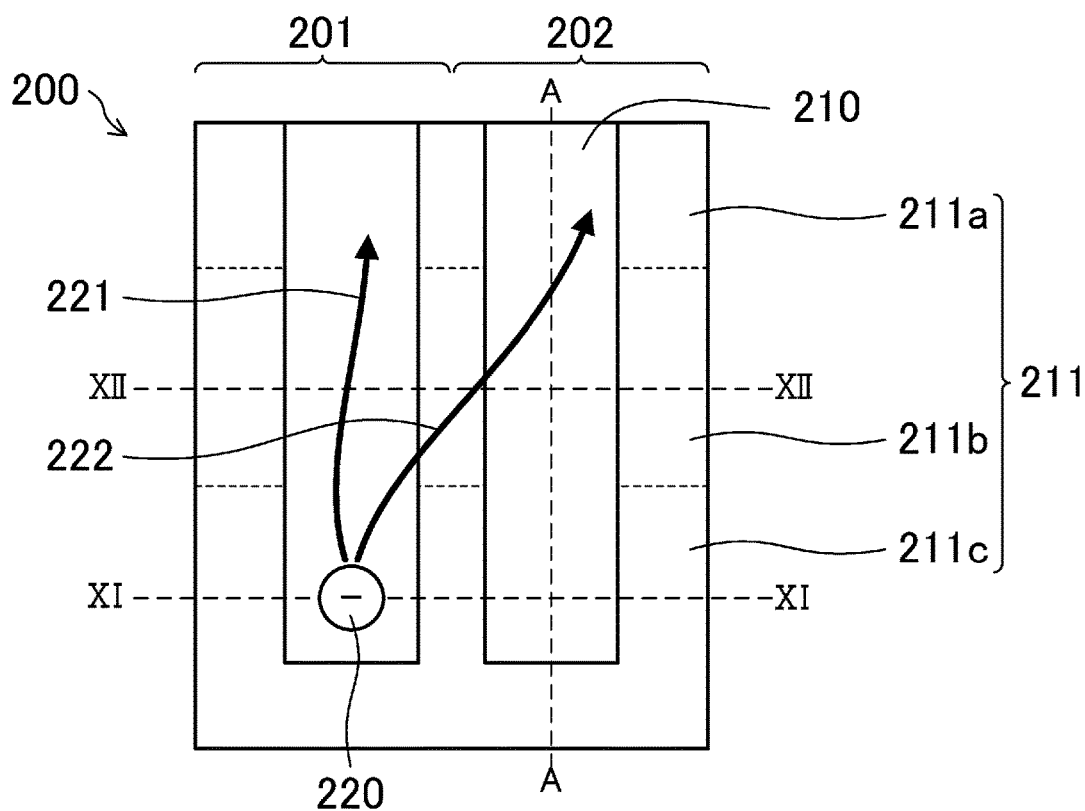
FIG. 10 is a diagram showing how color mixture occurs in the solid state imaging device of FIG. 9.

This will be further described with reference to FIG. 10. FIG. 10 more schematically shows a cross section of the solid state imaging device to show a range generally corresponding to two pixels (a pixel 201 and a pixel 202). A photoelectric conversion region 210 such as a photodiode formed on a semiconductor substrate, and an element separation region 211 provided between the photoelectric conversion regions 210 and having a potential gradient formed by introduction of an impurity or the like are shown. The element separation region 211 includes three regions 211a, 211b, and 211c from a shallow side to a deep side.

Figure 11:
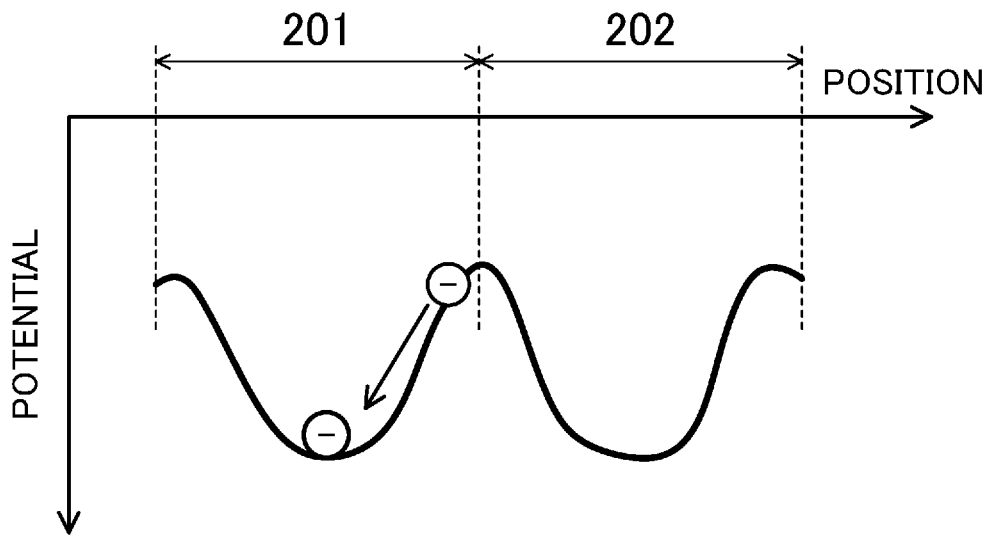
FIG. 11 is a diagram showing a potential at line XI-XI in FIG. 10.
Figure 12:
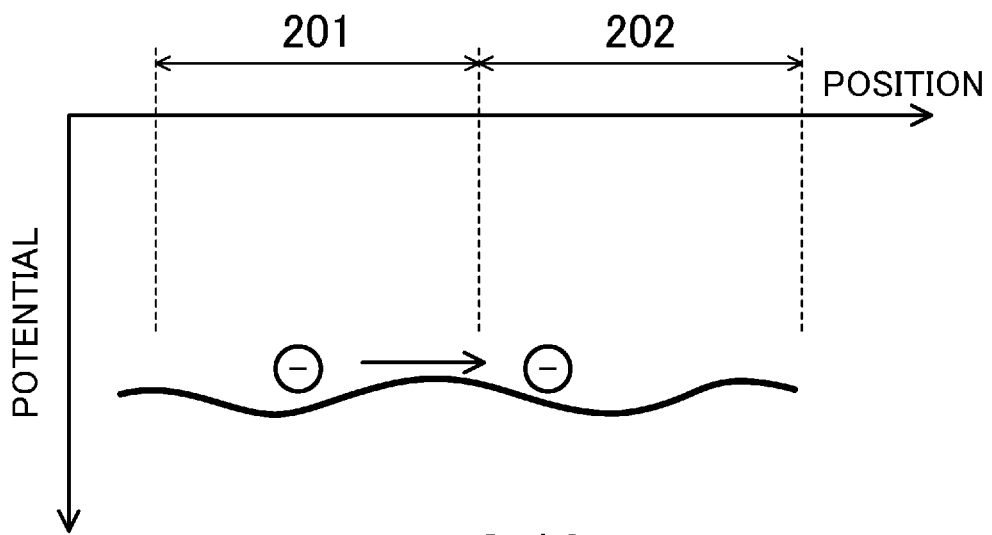
FIG. 12 is a diagram showing a potential at line XII-XII in FIG. 10.

Next, FIG. 11 and FIG. 12 illustrate potentials in the cross sections taken along lines XI-XI and XII-XII in FIG. 10. The horizontal axis shows positions corresponding to the pixel 201 and the pixel 202 in FIG. 10, and the vertical axis shows a potential in each pixel. The depth of line XI-XI in FIG. 10 corresponds to the overflow barrier layer 160 in FIG. 9. As illustrated in FIG. 11, a potential barrier is formed in the element separation region 211 between the pixels, and the pixels are separated.

Thus, at this depth, an action of holding the charges in the pixel works. In contrast, the depth of line XII-XII in FIG. 10 corresponds to the epitaxial layer 170 above the overflow barrier 160 in FIG. 10. At this depth, as illustrated in FIG. 12, the potential barrier is not sufficiently formed, and as a result, the pixels are not sufficiently separated from each other. Thus, the charge is not necessarily held in the pixel. As a result, a signal charge 220 generated in a deep part of the photoelectric conversion region 210 in the pixel 201 is read as a signal of the pixel 201 as indicated by an arrow 221 in FIG. 10. In addition, as indicated by an arrow 222, the signal charge 220 may flow into the pixel 202 adjacent thereto to be read as a signal of the pixel 202. When the charge is read as indicated by the arrow 222, a color mixture occurs.

Here, as illustrated in FIG. 10, the potential barrier of the deep region 211c of the element separation region 211 can be formed by, e.g., implanting ions on the semiconductor substrate 11 before forming the epitaxial layer 170. The potential barrier of the shallow region 211a of the element separation region 211 can also be formed by, e.g., implanting ions after forming the epitaxial layer 170. However, if the photoelectric conversion region 210 is thick, a general method such as ion implantation has an obstacle in forming a sufficient potential barrier in the intermediate region 211b which is a deep part in the epitaxial layer 170. That is, deeper ion implantation requires higher implantation energy, and thus a mask layer at the time of implantation needs to be thick. However, the miniaturization of pixels progresses, and it is difficult to form a sufficiently thick and fine mask.

Note that, in addition to the ion implantation, the element separation region can be formed by embedding an oxide film or the like in the semiconductor layer. However, it is also difficult to form such an element separation region due to an increased depth and miniaturization.

Next, decrease in the infrared sensitivity and read failure in the semiconductor device 100 will be described.

FIGS. 13, 14, 15, and 16 illustrate the potentials corresponding to the depth in FIG. 10. The horizontal axis shows the depth from the surface, and the vertical axis shows the potential. The solid line shows the potential of the photoelectric conversion region 210, and corresponds to the line A-A in FIG. 10. Note that the broken line is the potential of the element separation region 211 adjacent to the photoelectric conversion region 210.

Figure 13:
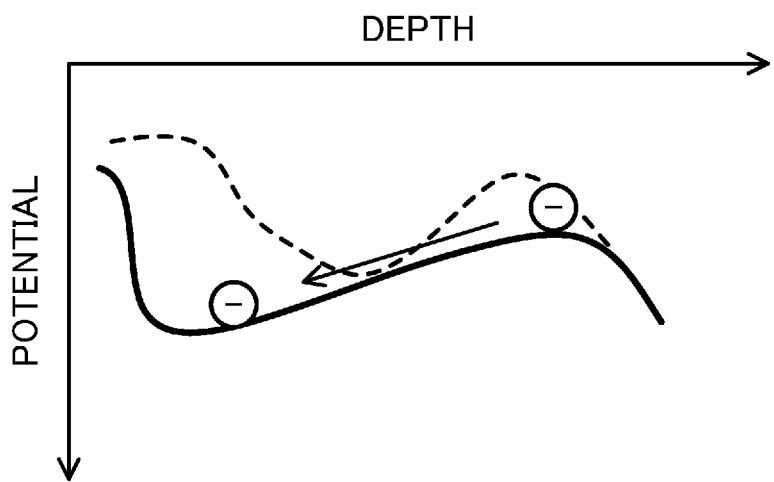
FIG. 13 is a diagram showing one example of a potential at line A-A in FIG. 10.
Figure 14:
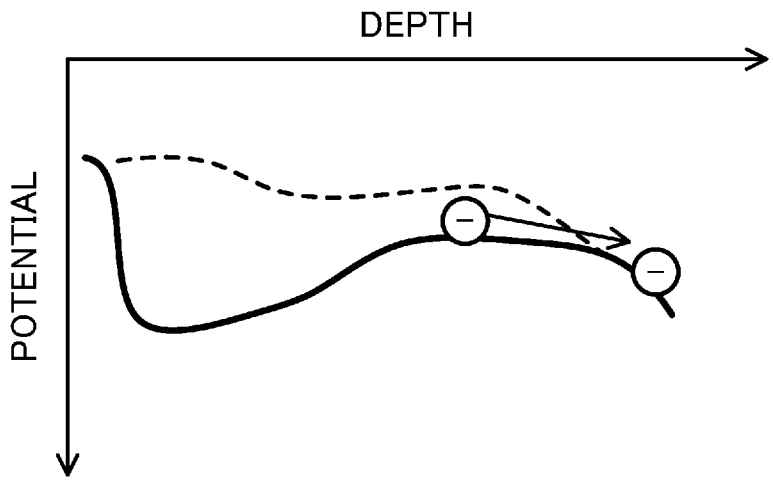
FIG. 14 is a diagram showing one example of a potential at line A-A in FIG. 10.
Figure 15:
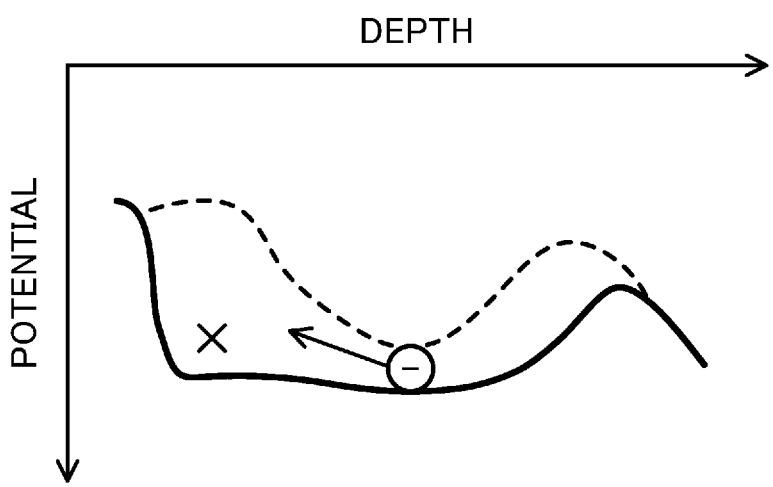
FIG. 15 is a diagram showing one example of a potential at line A-A in FIG. 10.

To read a signal charge generated in the deep part of the photoelectric conversion region 210, the potential gradient is preferably smoothly formed from the deep part toward the reading part (the shallow part) as illustrated in FIG. 13. On the contrary, if the potential gradient decreases toward the substrate (the deep part) as illustrated in FIG. 14, a part of charge cannot be read and the sensitivity is lowered. If the potential gradient is small from the deep part toward the shallow part as illustrated in FIG. 15, it is difficult to transfer the charge toward the reading part, and the reading characteristics are deteriorated.

Figure 16:
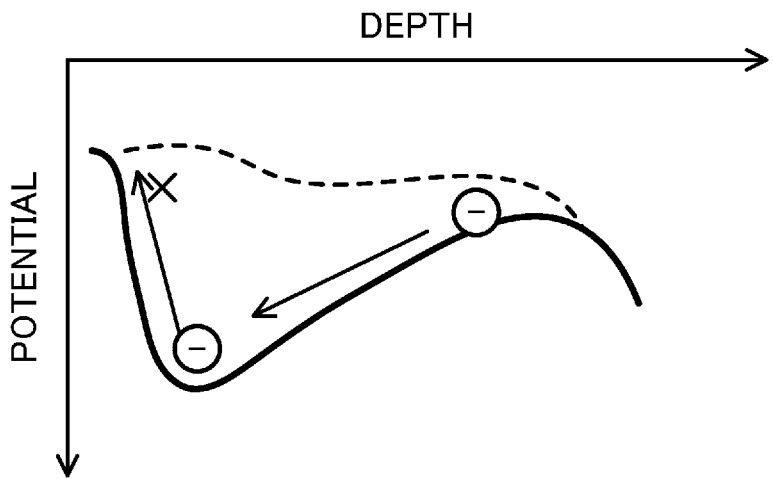
FIG. 16 is a diagram showing one example of a potential at line A-A in FIG. 10.

Here, to positively provide a potential gradient toward the reading part as illustrated in FIG. 16, it is conceivable to make the potential deep on the reading part side. However, the barrier to be overcome for reading is higher near of the surface, and the reading characteristics are deteriorated.

If the photoelectric conversion region has a large thickness, it is difficult to form a preferable potential gradient. As a result, the reading characteristics are likely to have defects.

(Solid State Imaging Device)

Figure 1:
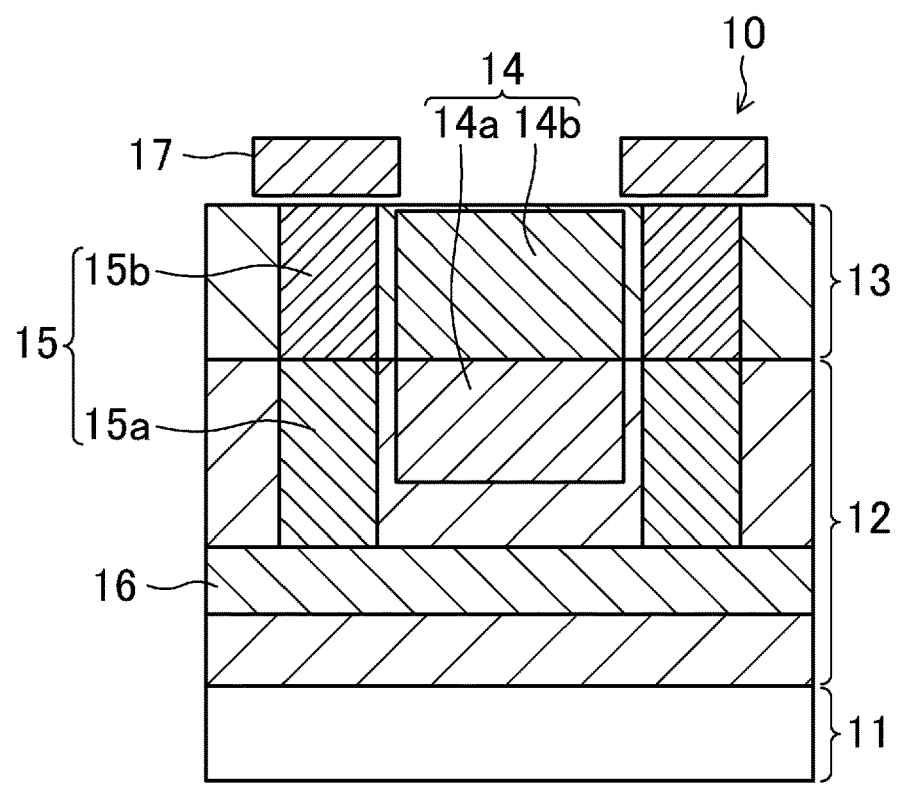
FIG. 1 is a schematic view of a cross sectional configuration of an exemplary solid state imaging device of one embodiment of the present disclosure.

The technique of the present disclosure corresponding to the above issues will be described below. FIG. 1 is a schematic view of a cross section of an exemplary solid state imaging device 10 of the present disclosure.

As illustrated in FIG. 1, the solid state imaging device 10 is formed by using a semiconductor substrate 11 which is, e.g., a silicon substrate. On the semiconductor substrate 11, a first epitaxial layer 12 of a first conductivity type (here, n type) and a second epitaxial layer 13 of a first conductivity type are sequentially laminated. Over the first epitaxial layer 12 and the second epitaxial layer 13 (in other words, across the boundary between the first epitaxial layer 12 and the second epitaxial layer 13 and continuously with the first epitaxial layer 12 and the second epitaxial layer 13), the photoelectric conversion region 14 and the element separation region 15 are formed by introduction of impurities. The photoelectric conversion region 14 includes a photoelectric conversion region first layer 14a formed in the first epitaxial layer 12 and a photoelectric conversion region second layer 14b formed in the second epitaxial layer 13. Similarly, the element separation region 15 includes an element separation region first layer 15a formed in the first epitaxial layer 12 and an element separation region second layer 15b formed in the second epitaxial layer 13.

A read gate 17 is formed on the second epitaxial layer 13. Further, an overflow barrier 16 for discharging surplus charge is formed in a region under the photoelectric conversion region 14 in the first epitaxial layer 12.

Here, the first epitaxial layer 12 has a film thickness of, e.g., 3 μm or more and 10 μm or less. The second epitaxial layer 13 has a film thickness of, e.g., 1 μm or more and 10 μm or less. If the first epitaxial layer 12 and the second epitaxial layer 13 are n-type, resistance values thereof are e.g., 0.1 Ω·cm or more and 100 Ω·cm or less. The resistance value of the second epitaxial layer 13 is formed to be equal to or smaller than the resistance value of the first epitaxial layer 12.

The element separation region 15 forms a sufficiently high potential barrier with respect to a central portion of the photoelectric conversion region 14 over the entire depth direction thereof. For this description, FIG. 2 illustrates impurity concentration distribution of the photoelectric conversion region 14, the element separation region 15, and the like.

Figure 2:
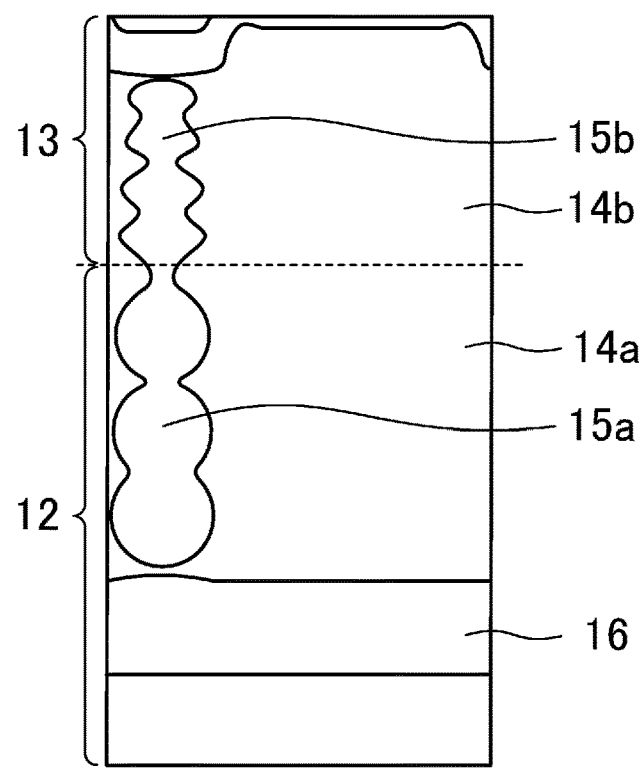
FIG. 2 is a diagram showing an impurity concentration of the solid state imaging device of FIG. 1.

Specifically, in FIG. 2, the n-type second epitaxial layer 13 is formed on the n-type first epitaxial layer 12. In the first epitaxial layer 12, an element separation region first layer 15a which is a p-type impurity layer is formed. In the second epitaxial layer 13, a second separation region second layer 15b which is a p-type impurity layer is formed. For the photoelectric conversion region 14, the first epitaxial layer 12 and the second epitaxial layer 13 which are surrounded by the element separation region 15 may be used as they are. The photoelectric conversion region 14 may also be formed by introduction of n-type impurities such as phosphorus, arsenic.

As described above, the element separation region 15 having the potential barrier around the photoelectric conversion region 14 over the entire depth direction such that a color mixture can be reduced even when the photoelectric conversion region 14 becomes thick.

In the deep part of the second epitaxial layer 13, an overflow drain 16 which is a p-type impurity layer is formed below the element separation region first layer 15a and the photoelectric conversion region first layer 14a.

A potential gradient capable of transferring charges from the overflow barrier 16 toward the reading part (an upper portion of the second epitaxial layer 13) is formed by adjusting the resistance value of the second epitaxial layer 13 and implanting impurities.

This will be described with reference to FIGS. 3 and 4.

Figure 3:
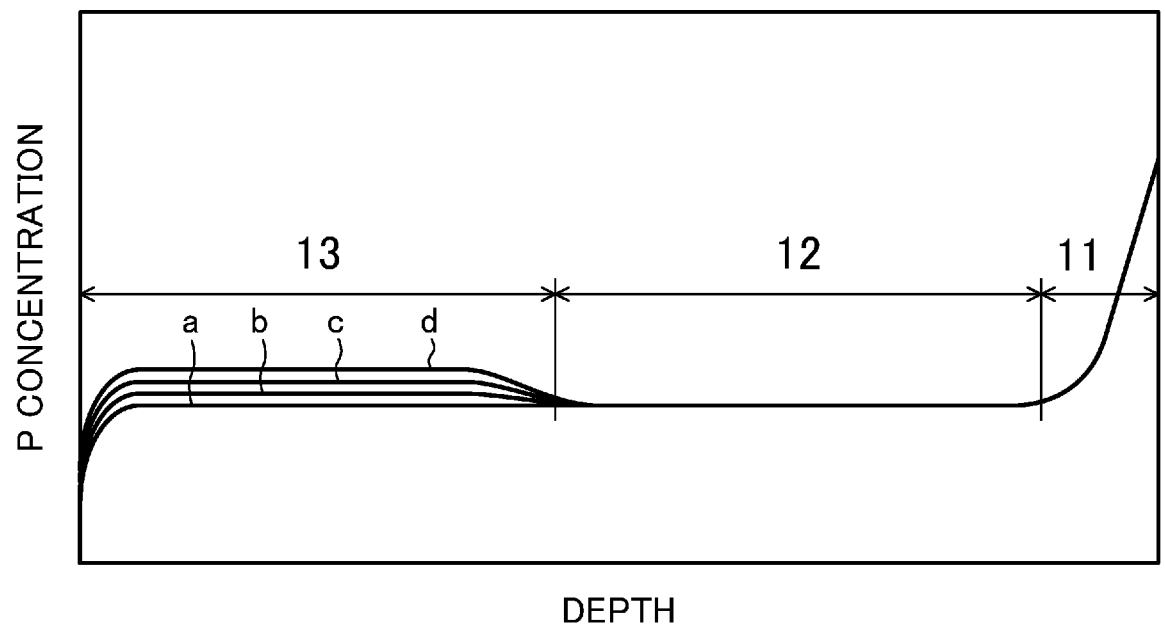
FIG. 3 is a diagram showing depth and concentrations of n-type impurities for three layers, namely, a semiconductor substrate, a first epitaxial layer, and a second epitaxial layer.

FIG. 3 illustrates a relationship between the depth and the concentration of phosphorus (P) which is an n-type impurity in the structure in which the first epitaxial layer 12 is formed on the semiconductor substrate 11 and the second epitaxial layer 13 is further formed on the first epitaxial layer 12. The horizontal axis shows the depth, and a top surface of the second epitaxial layer 13 is the origin. Thus, the second epitaxial layer 13, the first epitaxial layer 12, and the semiconductor substrate 11 are arranged from the shallow side. Here, the concentrations of the second epitaxial layer 13 are shown by four different curves (a, b, c, and d).

Figure 4:
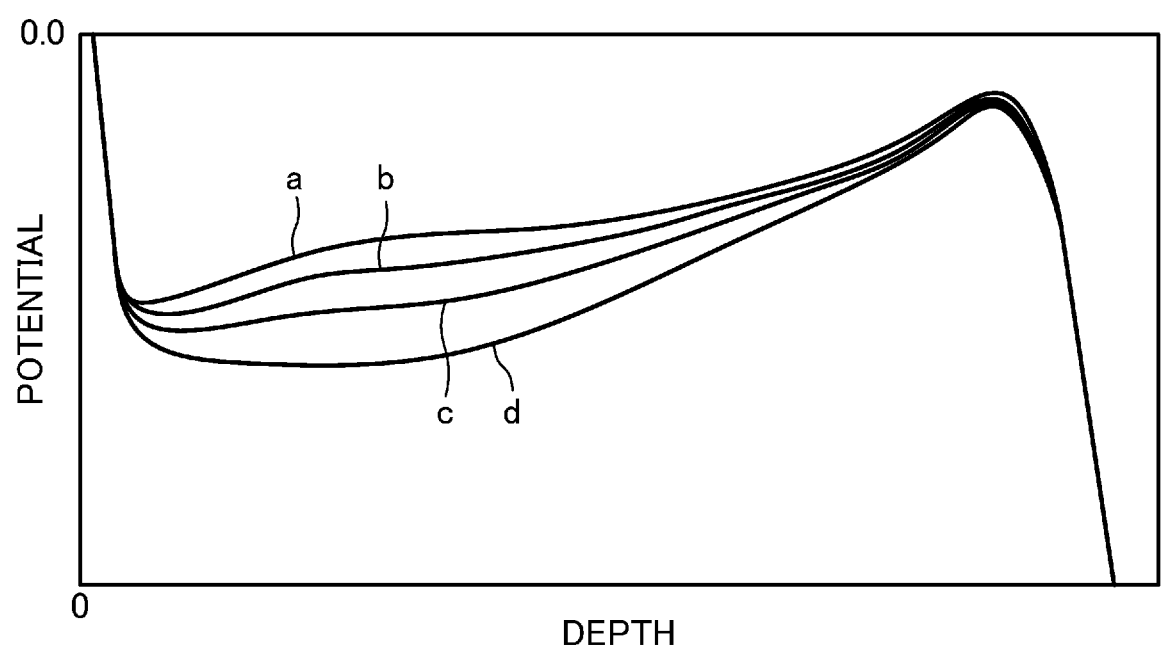
FIG. 4 is a diagram showing a relation between depth and potential appearing when impurity implantation is performed on the three layers of FIG. 3.

FIG. 4 illustrates a relationship between the depth and the potential when impurities are implanted on the first epitaxial layer 12 and the second epitaxial layer 13 which are illustrated in FIG. 3 to form the photoelectric conversion region 14. The conditions (concentration, dose, etc.) of the impurity implantation are constant, but the profile of the potential is different depending on the four levels of the concentration of the second epitaxial layer 13. Here, the reference characters a, b, c, and d in FIG. 3 correspond to those in FIG. 4. That is, the highest P concentration in FIG. 3 corresponds to the largest potential value a in FIG. 4. This also applies to b, c, and d. As such, for example, the impurity concentrations of the two epitaxial layers are adjusted such that a preferable potential gradient is formed, and then the reading characteristics can be improved.

This can provide preferable reading characteristics.

(Method for Manufacturing Solid State Imaging Device)

Next, a method for manufacturing the solid state imaging device 10 will be described with reference to FIGS. 5 to 8.

Figure 5:
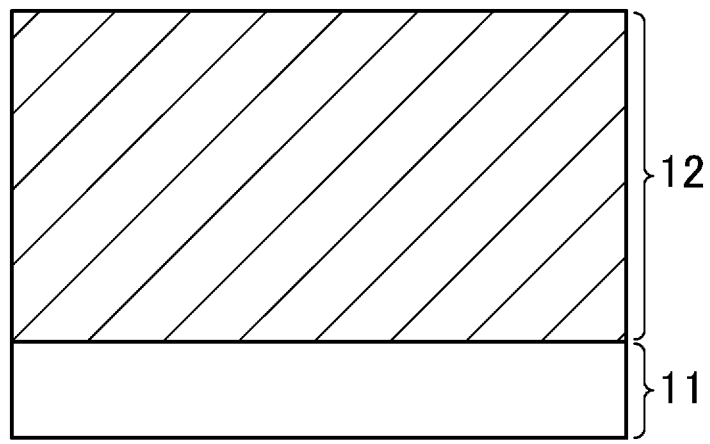
FIG. 5 is a diagram showing a method of manufacturing the solid state imaging device of FIG. 1.

First, as illustrated in FIG. 5, the first epitaxial layer 12 is grown on the semiconductor substrate 11. The semiconductor substrate 11 is, e.g., a silicon substrate, and the concentration of P as an n-type impurity is $1 \times 10^{13}$ to $1 \times 10^{18}$ cm$^{-3}$. The first epitaxial layer 12 is made of silicon by, e.g., chemical vapor deposition (CVD) so that the n-type impurity concentration is $1 \times 10^{13}$ to $1 \times 10^{16}$ cm$^{-3}$.

Here, to reduce an influence of unevenness of the concentration of the semiconductor substrate 11, an epitaxial layer (not shown) having the same N type impurity concentration as that of the semiconductor substrate 11 may be provided with a film thickness of, e.g., 1 to 6 μm between the semiconductor substrate 11 and the epitaxial layer 12.

Figure 6:
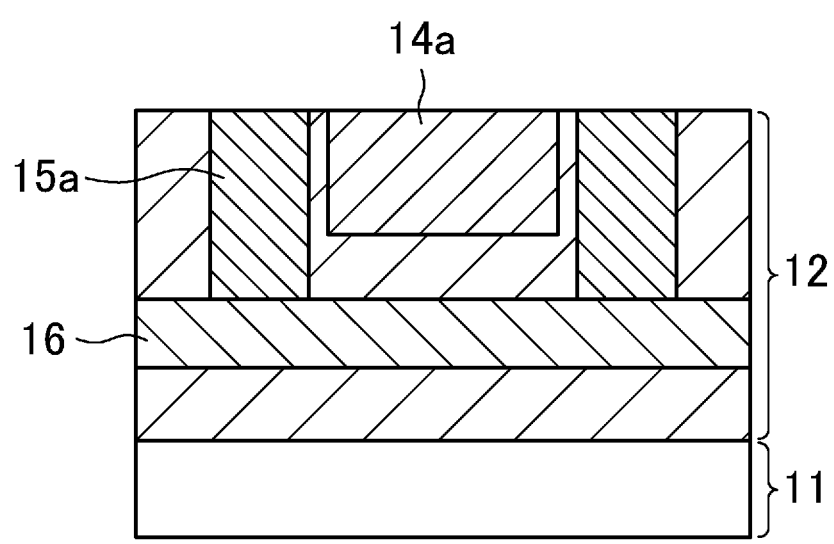
FIG. 6 is a diagram showing the method of manufacturing the solid state imaging device of FIG. 1.

Next, a step of FIG. 6 is performed. First, the overflow barrier 16, the element separation region first layer 15a, and the photoelectric conversion region first layer 14a are formed in the first epitaxial layer 12. For this step, for example, a mask is formed by a photolithography technique, and impurities are introduced by an ion implantation method.

To form the overflow barrier 16, for example, B is used as a p-type impurity, and implantation is performed under the conditions of an implantation energy of 1000 to 10000 keV and a dose of $1 \times 10^{10}$ to $1 \times 10^{13}$ cm$^{-2}$. To form the element separation region first layer 15a, B is used as a p-type impurity, and implantation is performed under the conditions of an implantation energy of 50 to 10000 keV and a dose of $1 \times 10^{10}$ to $1 \times 10^{13}$ cm$^{-2}$. Similarly, to form the photoelectric conversion region first layer 14a, P is used as an n-type impurity, and implantation is performed under the conditions of an implantation energy of 100 to 10000 keV and a dose of $1 \times 10^{10}$ to $1 \times 10^{13}$ cm$^{-2}$. Note that, instead of P, As may be implanted as an n-type impurity. In addition, impurity implantation for the photoelectric conversion region first layer 14a might not be performed, and the first epitaxial layer 12 formed to contain impurities can be used as a photoelectric conversion region.

Figure 7:
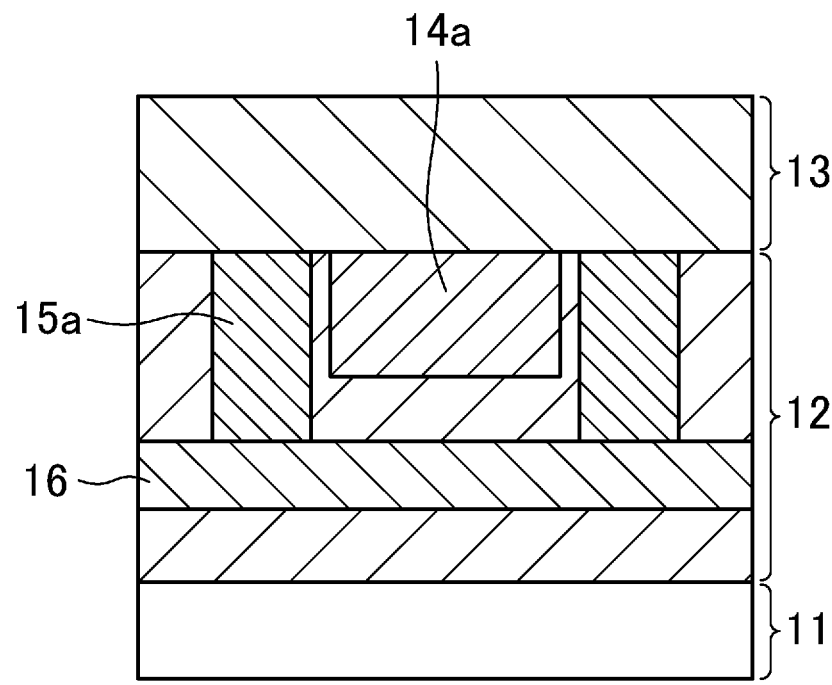
FIG. 7 is a diagram showing the method of manufacturing the solid state imaging device of FIG. 1.

Next, as illustrated in FIG. 7, the second epitaxial layer 13 is formed on the first epitaxial layer 12. This may be formed similarly to the first epitaxial layer 12. Note that the impurity concentration of the second epitaxial layer 13 is preferably higher than the impurity concentration of the first epitaxial layer 12. Here, for example, $1 \times 10^{10}$ to $1 \times 10^{13}$ cm$^{-3}$ is adopted.

Figure 8:
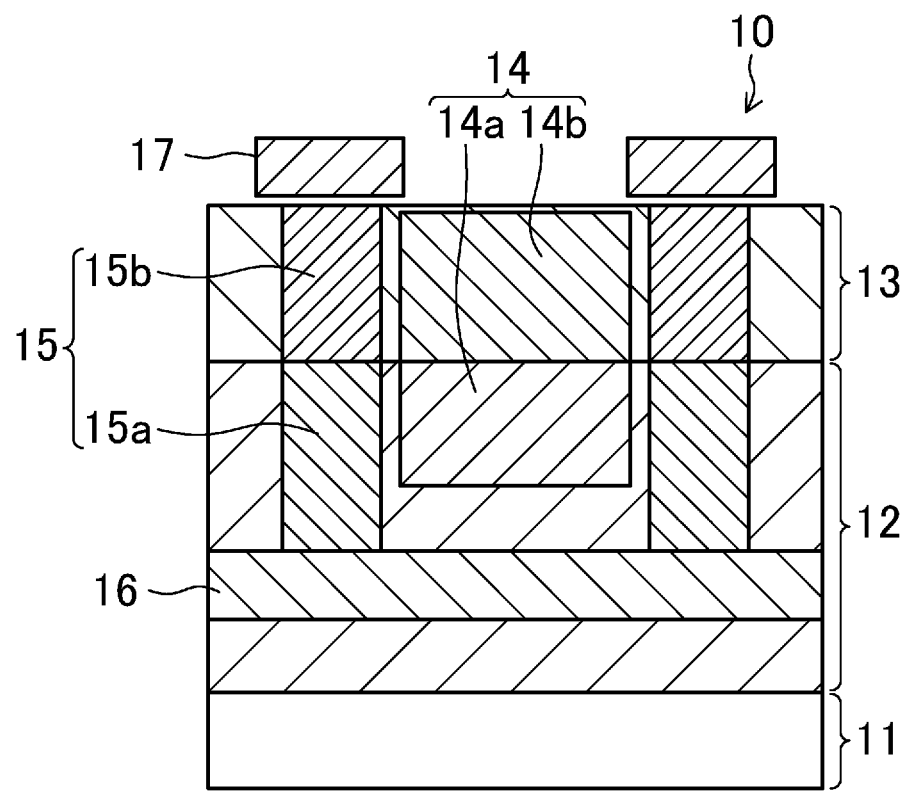
FIG. 8 is a diagram showing the method of manufacturing the solid state imaging device of FIG. 1.

Next, as illustrated in FIG. 8, the element separation region second layer 15b and the photoelectric conversion region second layer 14b are formed in the second epitaxial layer 13. Similarly to the step of FIG. 6, these are formed by, e.g., a photolithography technique and an ion implantation technique.

To form the element separation region second layer 15b, B is used as a p-type impurity, for example, and implantation is performed under the conditions of an implantation energy of 50 to 10000 keV and a dose of $1 \times 10^{10}$ to $1 \times 10^{13}$ cm$^{-2}$. Similarly, to form the photoelectric conversion region second layer 14b, P is used as an n-type impurity, and implantation is performed under the conditions of an implantation energy of 100 to 10000 keV and a dose of $1 \times 10^{10}$ to $1 \times 10^{13}$ cm$^{-2}$.

Note that, instead of P, As may be implanted as an n-type impurity. In addition, impurity implantation for the photoelectric conversion region second layer 14b might not be performed, and the second epitaxial layer 13 formed to contain impurities can be used as a photoelectric conversion region.

At this time, the element separation region first layer 15a is connected to the element separation region second layer 15b to form the element separation region 15 so that the element separation region 15 is provided in a range extending between the first epitaxial layer 12 and the second epitaxial layer 13. The photoelectric conversion region second layer 14b and the photoelectric conversion region first layer 14a constitute the photoelectric conversion region 14.

Thereafter, a read region (not shown) is formed on the second epitaxial layer 13, and the read gate 17 is further formed on the second epitaxial layer 13.

As described above, in the method for manufacturing the solid state imaging device of the present embodiment, a relatively thin epitaxial layer is formed, and an element separation region and a photoelectric conversion region are formed in the epitaxial layer by ion implantation. The epitaxial layer is thin, and thus ion implantation can be easily performed. Such steps are repeated, epitaxial layers are stacked, and the element separation region and the photoelectric conversion region formed in the epitaxial layers are made continuous in the depth direction.

With such a manufacturing method, even if the photoelectric conversion region 14 is deep, it is easy to form the element separation region 15 constituting the potential barrier surrounding the photoelectric conversion region 14 over the entire depth direction. The impurity concentrations of the epitaxial layers and/or the photoelectric conversion region are set such that a preferable potential gradient can be formed.

Note that, in the present embodiment, the first and second two-layer epitaxial layers are formed, but that is not limited thereto, and three- or more layer epitaxial layers may be formed. In this case, a part of the element separation region and a part of the photoelectric conversion region are formed in each of the epitaxial layers, and the element separation region and the photoelectric conversion region are formed so as to be continuous with the stacked epitaxial layers. In this way, for example, even if the photoelectric conversion region is deep further, or miniaturized further, the element separation region can be reliably formed.

Even if three or more epitaxial layers are provided as described above, the impurity concentration of the part of the photoelectric conversion region (such as the photoelectric conversion region first layer) provided in the epitaxial layer is preferably equal to or higher than that of the part of the photoelectric conversion region provided in the epitaxial layer adjacent to a deeper side. The impurity concentration of each part of the photoelectric conversion region is determined by the impurity concentration of the corresponding epitaxial layer itself and the concentration of impurity introduced by, e.g., ion implantation (if introduced). Thus, it is preferable that the epitaxial layer closer to the surface of the substrate has a higher impurity concentration, but this is not essential.

In this embodiment, the element separation region 15 is realized by a potential barrier by impurity implantation. However, the present embodiment is not limited thereto. For example, the pixels may be physically separated by embedding an oxide film, a metal film, or the like in the epitaxial layer. Such an element separation region is easily formed finely and deeply by laminating a plurality of layers as disclosed in the present disclosure.

Further, in the above, the surface illumination type imaging device in which light is incident from the surface side on which the wiring layer is formed has been described. However, the present embodiment is not limited thereto, and may be directed to a back-surface illumination type imaging device in which light is incident from the side opposite to the surface on which the wiring layer is formed.

The solid state imaging device of the present disclosure causes less color mixture and read failure even when the photoelectric conversion region becomes thick, and thus is useful as, for example, a solid state imaging device with improved infrared sensitivity and a manufacturing method thereof.

What is claimed is:

1. A solid state imaging device, wherein
a plurality of pixels are arranged in a matrix on a substrate,
each of the plurality of pixels includes a photoelectric conversion region and an element separation region separating the photoelectric conversion region,
the substrate includes a semiconductor substrate, a first epitaxial layer formed on the semiconductor substrate, and a second epitaxial layer formed on the first epitaxial layer,
the photoelectric conversion region and the element separation region are formed over the first epitaxial layer and the second epitaxial layer, wherein an impurity concentration of a part of the photoelectric conversion region provided in the second epitaxial layer is equal to or higher than an impurity concentration of a part of the photoelectric conversion region provided in the first epitaxial layer
the first epitaxial layer includes a drain part for discharging an excessive charge generated in the photoelectric conversion region,
the drain part has a different conductivity type from the first epitaxial layer,
the photoelectric conversion region is surrounded by the element separation region and the drain part, and
a potential barrier of the drain part is lower than a potential barrier of the element separation region.

2. The solid state imaging device of claim 1, wherein
the element separation region is a region into which an impurity is introduced in the first epitaxial layer and the second epitaxial layer, and the element separation region has a higher potential barrier over the entire depth direction thereof than the photoelectric conversion region adjacent to the element separation region.

3. The solid state imaging device of claim 1, comprising:
a reading part for reading a charge from the photoelectric conversion region; and
a reading electrode for controlling the reading part,
wherein
a potential barrier of the reading part is lower than a potential barrier of the element separation region.

4. The solid state imaging device of claim 1, further comprising:
at least one different epitaxial layer between the first epitaxial layer and the second epitaxial layer
wherein
the photoelectric conversion region and the element separation region are also formed in the different epitaxial layer,
impurity concentrations of parts of the photoelectric conversion region provided in the at least one different epitaxial layer and the second epitaxial layer are equal to or higher than an impurity concentration of a part of the photoelectric conversion region provided in one of the different epitaxial layers adjacent to a deeper side of the substrate or the first epitaxial layer.

5. The solid state imaging device of claim 1, wherein
an impurity concentration of the second epitaxial layer is higher than an impurity concentration of the first epitaxial layer.

* * * * *